United States Patent [19]
Tanaka et al.

[11] Patent Number: 5,698,927
[45] Date of Patent: Dec. 16, 1997

[54] SURFACE ACOUSTIC WAVE DEVICE

[75] Inventors: Mitsuhiro Tanaka, Chita-Gun; Masao Takeuchi, Natori; Kazuhiko Yamanouchi; Hiroyuki Odagawa, both of Sendai, all of Japan

[73] Assignee: NGK Insulators, Ltd., Japan

[21] Appl. No.: 524,060

[22] Filed: Sep. 6, 1995

[30] Foreign Application Priority Data

Sep. 28, 1994 [JP] Japan .................... 6-233550

[51] Int. Cl.$^6$ .................................................. H01L 41/08
[52] U.S. Cl. ............................ 310/313 A; 310/313 B; 310/313 D
[58] Field of Search ........................ 310/313 A, 313 B, 310/313 D

[56] References Cited

U.S. PATENT DOCUMENTS

| | | | |
|---|---|---|---|
| 4,162,465 | 7/1979 | Hunsinger et al. | 310/313 |
| 4,429,246 | 1/1984 | Miyajima | 310/313 B |
| 4,489,250 | 12/1984 | Ebata et al. | 310/313 A |
| 4,523,119 | 6/1985 | Whatmore et al. | 310/313 A |
| 4,634,913 | 1/1987 | Whatmore et al. | 310/313 A |
| 4,642,506 | 2/1987 | Lewis | 310/313 D |
| 4,672,255 | 6/1987 | Suzuki et al. | 310/313 A |
| 5,264,751 | 11/1993 | Dufilie et al. | 310/313 B |
| 5,306,978 | 4/1994 | Yamanouchi et al. | 310/313 C |
| 5,438,306 | 8/1995 | Yamanouchi et al. | 310/313 B |
| 5,550,793 | 8/1996 | Dufilie | 310/313 B |

FOREIGN PATENT DOCUMENTS

| | | | |
|---|---|---|---|
| 3119815 | 5/1981 | Japan | 310/313 B |
| 2-44169 | 10/1990 | Japan | H01L 41/18 |

OTHER PUBLICATIONS

Proceedings of the Ultrasonics Symposium, Baltimore, Oct. 31–Nov. 3, 1993; vol. 1, Oct. 31, 1993; Levy M;McAvoy B R, pp. 185–188, XP000473555 Lam C S et al.: "A Low–Loss Saw Filter Using Two–Finger Per Wavelength Electrodes on the NSPUDT Orientation of Quartz"; p. 185, left-hand column, line 41—right-hand column, line 9; p. 186, left-hand column, line 11—right-hand column, line 2.

*Primary Examiner*—Thomas M. Dougherty
*Attorney, Agent, or Firm*—Parkhurst, Wendel & Burr, L.L.P.

[57] ABSTRACT

A surface acoustic wave device including a substrate made of a lithium tetraborate single crystal ($Li_2B_4O_7$) whose cut and propagating direction are determined such that Euler cut angles ($\psi$, $\theta$, $\phi$) are $\psi=+5°\sim-5°$, $\theta=9°\sim29°$ and $32°\sim86°$ and $\phi=85°\sim95°$, and an electrode structure formed on a surface of the substrate to realize a natural single-phase unidirectional transducer property together with an anisotropy of said substrate. A lithium tetraborate substrate having cut angles of (0°, 51°, 90°) shows an ideal NSPUDT and a lithium tetraborate substrate having cut angles of (0°, 78°, 90°) reveals a zero temperature coefficient of delay. A directionality reversed electrode structure or a directionality corrected electrode structure may be advantageously used.

13 Claims, 16 Drawing Sheets

$(0°, \theta, 90°)$

FIG_3
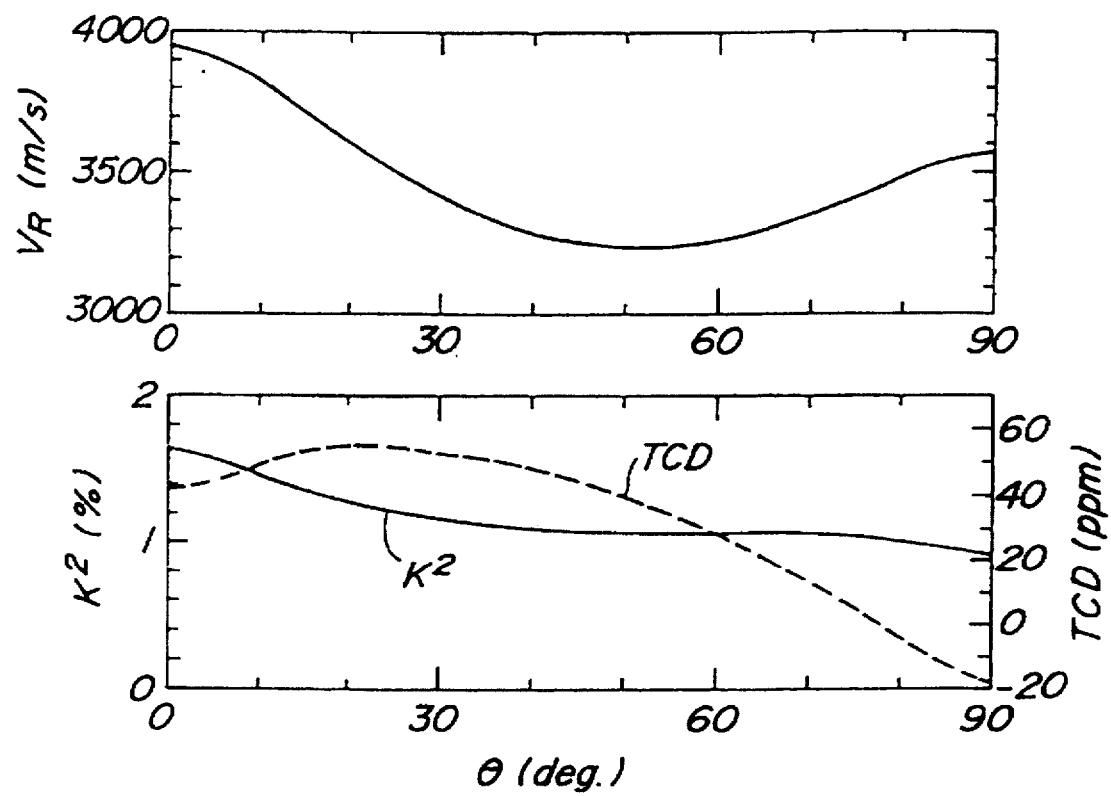

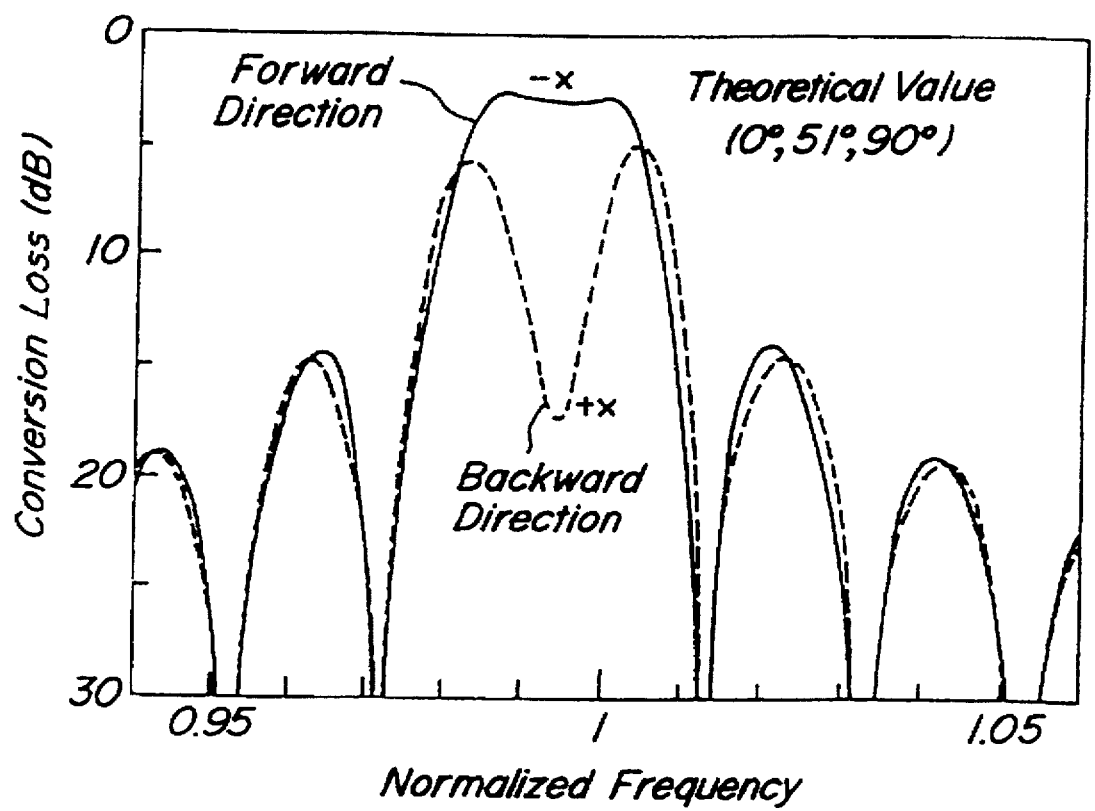
FIG_4

FIG_5
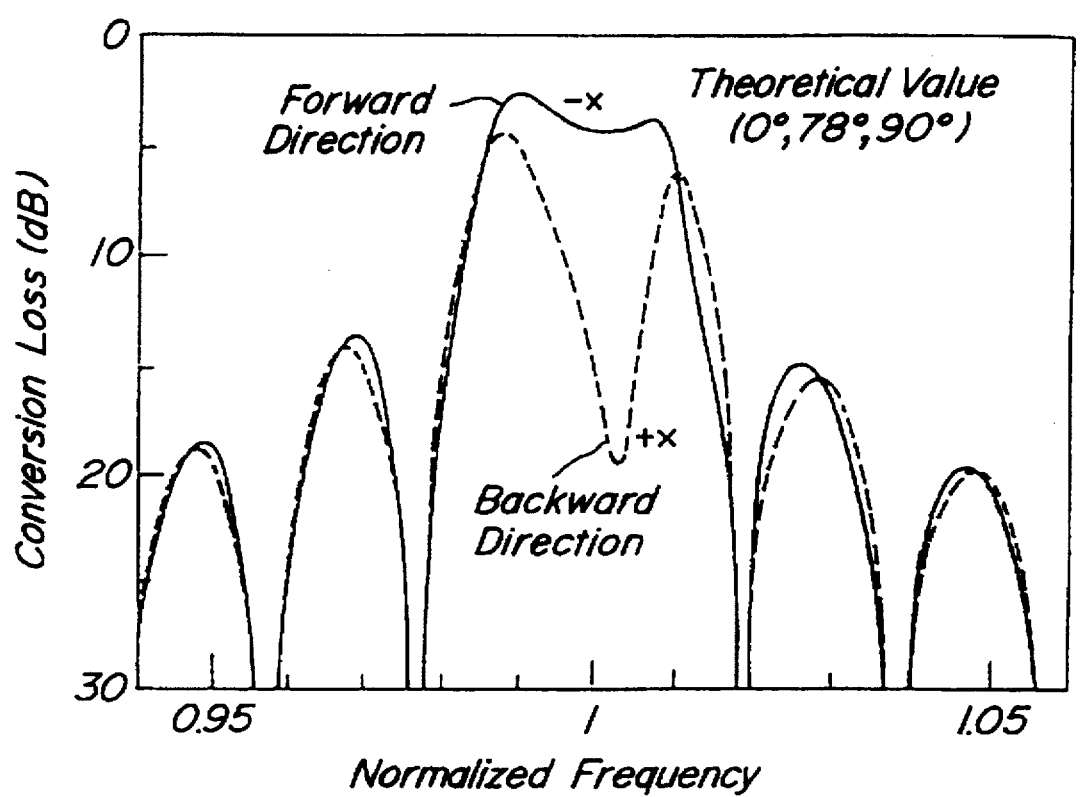

FIG_6
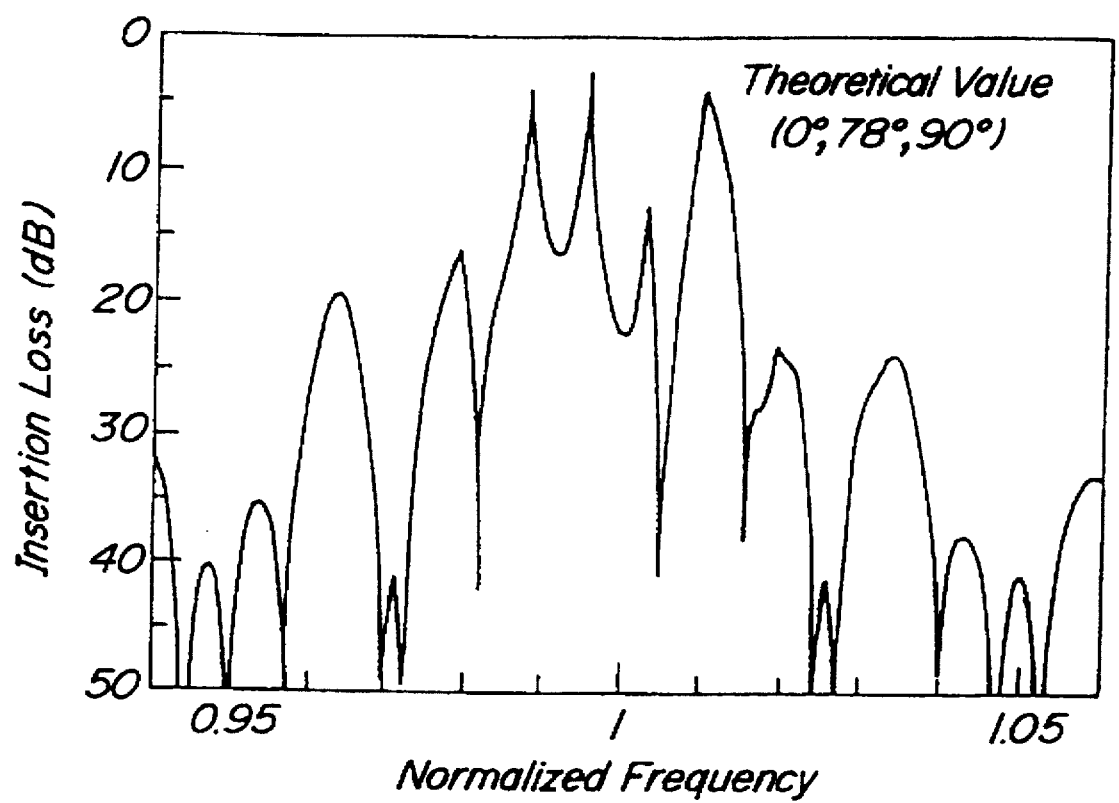

FIG_7
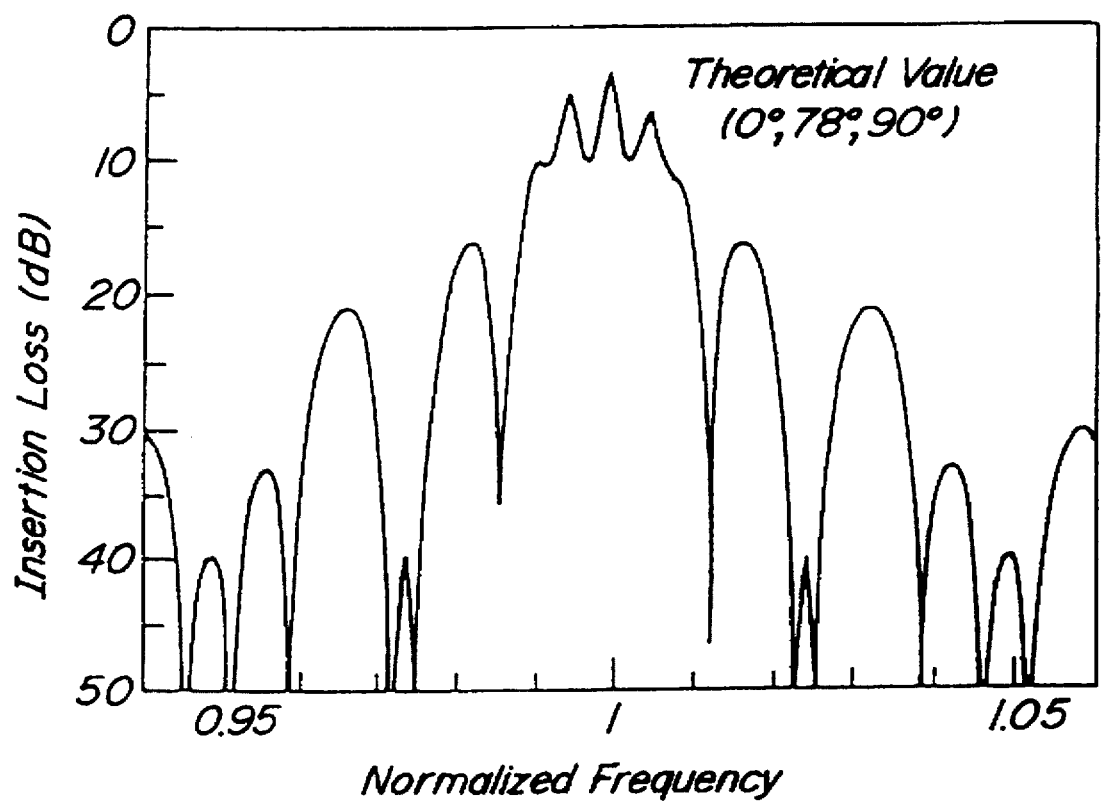

FIG_11

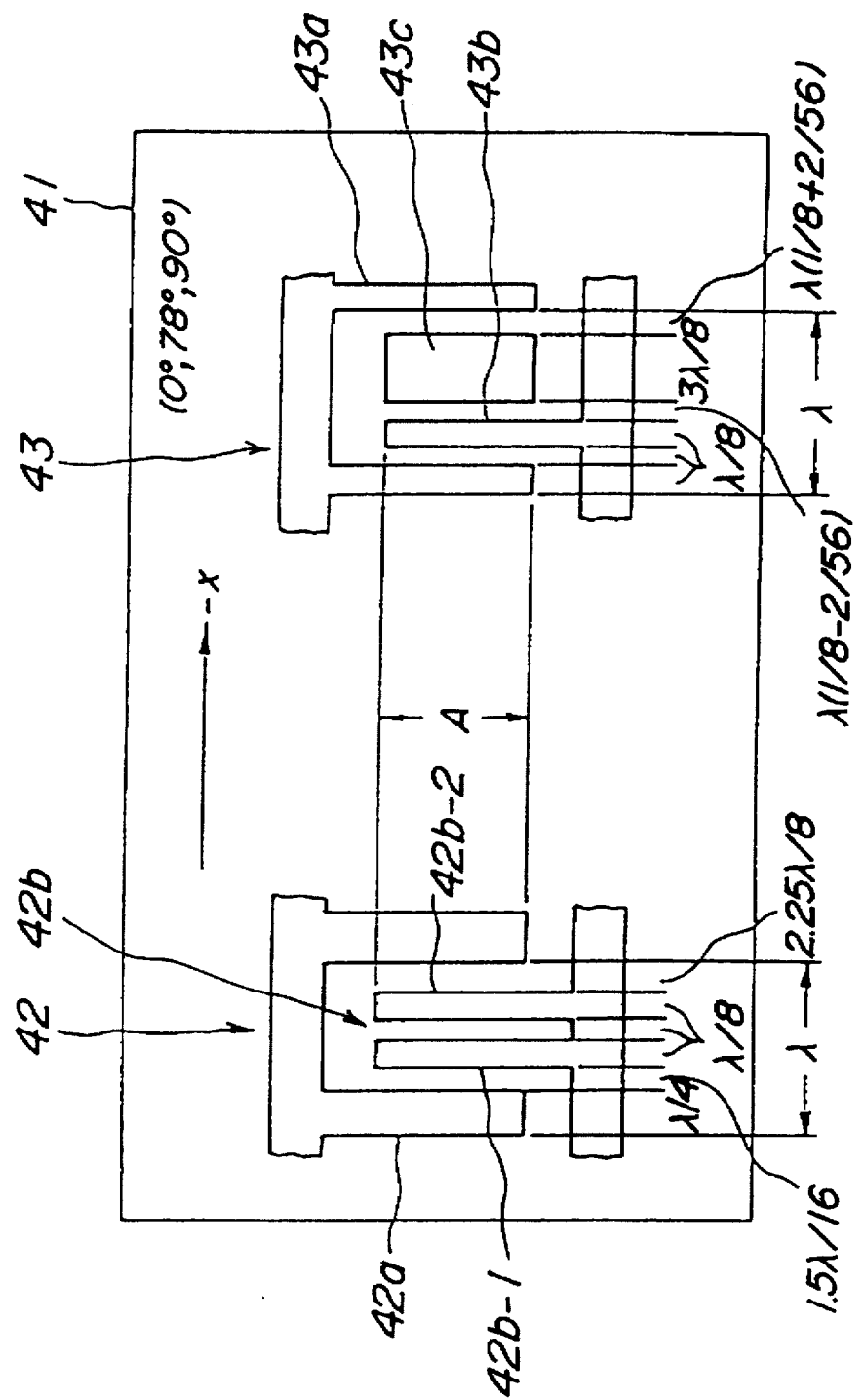

FIG_15
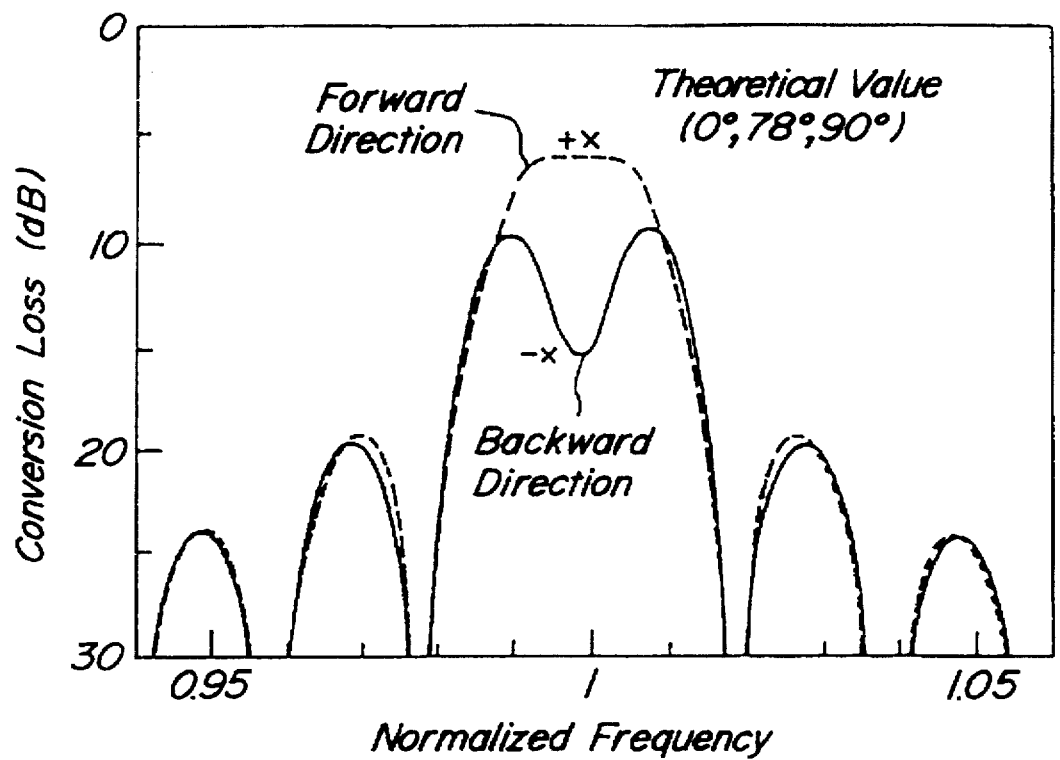

FIG_16
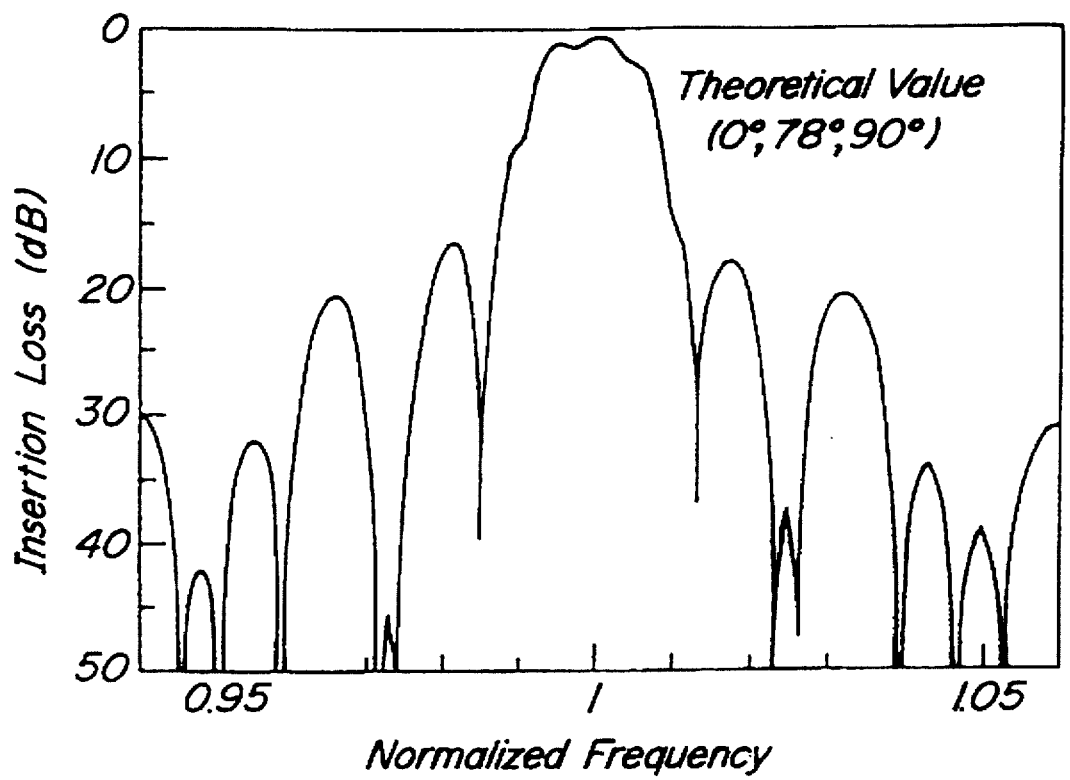

SURFACE ACOUSTIC WAVE DEVICE

BACKGROUND OF THE INVENTION

1. Field of the Invention

The present invention relates to a surface acoustic wave device (SAW device) for use in surface acoustic wave filters, surface acoustic resonators and the like, and more particularly to a surface acoustic wave device utilizing a natural single-phase unidirectional transducer property.

2. Related Art Statement

As one of surface acoustic wave devices, there has been widely used a transversal type SAW filter, in which on a piezoelectric substrate there are arranged a transmitter side transducer including positive and negative electrodes which are arranged in an interdigital manner and are connected to 180° phase inverted output terminals of a signal source generator and a receiver side transducer including interdigitally arranged positive and negative electrodes.

In such a SAW filter, it is required to suppress insertion loss and ripple within a given frequency band as much as possible. When a usual electrode structure of interdigital type is used, the transducer is of a bidirectionality type, so that a theoretical insertion loss of 6 dB is introduced and insertion loss could not be made smaller than 6 dB. In order to mitigate such a drawback, there has been proposed a multi-electrode structure (multi-transducer type), in which a plurality of receiver side transducers are arranged on both sides of each of a plurality of transmitter side transducers. In a SAW filter having such a multi-electrode structure, it is possible to decrease an insertion loss to about 1.5-2 dB. However, in such a SAW filter, it is very difficult to control the transducers and good phase and frequency characteristics cannot be attained. Moreover, the multi-electrode structure cannot be manufactured easily. In this respect, it should be noted that in order to improve the properties of SAW devices, not only small insertion loss, but also flatness of phase characteristics and improvement of frequency characteristics such as a ripple within a pass band and a cut-off band have to be taken into consideration.

In order to satisfy the above mentioned requirements, there have been practically used unidirectional transducers which could realize a low insertion loss smaller than 1 dB as well as good phase and frequency characteristics. There have been proposed various kinds of unidirectional transducers and they may be roughly classified into (a) multi-phase unidirectional transducers and (b) single-phase unidirectinal transducers. As the latter single-phase unidirectional transducers, there have been proposed various types such as a single-phase unidirectional transducer using an asymmetry in an electrode structure or an internal reflection due to a mechanical loading effect of an electrode; a reflection bank type single-phase unidirectional transducer having a reflection bank arranged between exciting electrodes; a floating electrode type single-phase unidirectional transducer using reflection due to a floating electrode; and a natural single-phase unidirectional transducer utilizing an anisotropy of a substrate. In these unidirectional transducers, the unidirectionality is obtained by a fact that phases of an exciting wave and a reflected wave become in-phase in a forward direction, but become opposite-phase in a backward direction.

In the single-phase unidirectional transducers other than the natural single-phase unidirectional transducer, the electrode structure becomes very complicated, and particularly a distance between adjacent edges of successive interdigital electrodes and a width of electrode fingers have to be smaller than λ/4, wherein λ is a wavelength of a surface acoustic wave. Upon increasing an operating frequency said distance and width become very small, so that it is rather difficult to manufacture an electrode structure precisely.

The natural single-phase unidirectional transducer (hereinafter called NSPUDT) has been proposed in which the above mentioned drawbacks can be mitigated. In NSPUDT, the unidirectionality can be attained by an anisotropy of a substrate itself, so that although a regular or normal type electrode structure in which electrode fingers having a width of λ/4 are arranged with an edge distance of λ/4 is used, it is possible to realize unidirectionality. There have been known various piezoelectric substrates which show NSPUDT properties such as quartz substrates, $LiNbO_3$ substrates and $LiTaO_3$ substrates. However, there has not been developed an ideal NSPUDT since an electromechanical coupling constant $K^2$ is small, a zero temperature coefficient of delay (TCD) could not be obtained, a power flow angle (PFA) is not zero and a directionality reversed electrode structure could not be easily realized.

SUMMARY OF THE INVENTION

The present invention has for its object to provide a novel and useful surface acoustic wave device, which can remove or at least mitigate the above mentioned problems of the known NSPUDTs and can realize a surface acoustic wave device having practically usable characteristics.

According to the invention, a surface acoustic wave device comprises:

a substrate made of a single crystal of lithium tetraborate ($Li_2B_4O_7$) whose cut and propagating direction are determined such that cut angles represented by Euler angles ($\psi$, $\theta$, $\phi$) are $\psi=+5°\sim-5°$, $\theta=9°\sim29°$ and $32°\sim86°$ and $\phi=85°\sim95°$; and at least one electrode structure formed on a surface of said substrate to realize NSPUDT behaviour together with an anisotropy of the substrate.

It has been known to use a single crystal of lithium tetraborate as a piezoelectric substrate of a surface acoustic wave device as described in JP-B-2-44169 and a preliminary theses in "1994 Spring Meeting of The Institute of Electronics, Information and Communication Engineers (IEICE)", p. 1–446. In the latter publication, there is disclosed a lithium tetraborate substrate having cut angles of (0°, 47.3°, 90°). This orientation is within said range of the present invention. However, known surface acoustic wave devices having lithium tetraborate substrates do not utilize a fact that the lithium tetraborate substrate has inherently the NSPUDT unidirectionality. In other words, these known SAW devices do not use an electrode structure which can yield the unidirectionality together with the anisotropy of the lithium tetraborate substrate.

According to the invention, a desired NSPUDT property can be obtained by combining the lithium tetraborate substrate having an anisotropy and the electrode structure which can yield the unidirectionality together with the anisotropy of the substrate. As the electrode structure of the surface acoustic wave device according to the invention, use may be made of a usual normal type electrode structure, in which positive and negative electrode fingers having a width of λ/4 are arranged interdigitally with an edge spacing of λ/4. In the known SAW devices including the lithium tetraborate substrates, such a normal type electrode structure has not been used. Therefore, NSPUDT unidirectionality is not realized.

In the surface acoustic wave device according to the invention, the cutting angles of the lithium tetraborate substrate represented by the Euler angles (ψ, θ, φ) are set to ψ=+5°~−5°, θ=9°~29° and 32°~86° and φ=85°~95°. Now a reason for setting such ranges will be explained. The angles ψ and φ are optimally 0° and 90°, respectively, but the ranges are set by considering manufacturing errors. That is to say, the inventors have confirmed that the desired result can be attained even if the angles ψ and φ deviate from 0° and 90°, respectively by ±5°. The angle θ is a parameter relating to the anisotropy. The inventors have confirmed that when the angle θ is set to a value near 0°, 30° and 90°, it is impossible to obtain the NSPUDT unidirectionality by a combination of any electrode structure. Near 0°, a reflection by an electrode which is important for realizing the NSPUDT unidirectionality is weak, and near 30° and 90°, a difference in phase of a reflected wave and a excited wave could not be set to a necessary value for obtaining the NSPUDT behaviour, so that the unidirectionality could not be realized even by shifting a position of the electrode structure.

BRIEF DESCRIPTION OF THE DRAWINGS

FIG. 3 is a graph denoting a variation of several parameters of the substrate with respect to the cut angle θ in the SAW device according to the invention;

FIG. 4 is a graph showing a theoretical conversion loss of NSPUDT for θ=51°;

FIG. 5 is a graph representing a theoretical conversion loss of NSPUDT for θ=78°;

FIG. 6 is a graph showing a theoretical insertion loss of SAW filter, in which λ/4 normal type electrode structures are arranged on the substrate as transmitter and receiver side transducers;

FIG. 7 is a graph showing a theoretical insertion loss of SAW filter, in which λ/8 double-electrode structures are arranged on the substrate as transmitter and receiver side transducers;

FIG. 14 is a plan view showing an electrode structure of a fourth embodiment of the SAW device according to the invention using a substrate having a cut angle θ=78°;

FIG. 15 is a graph representing a theoretical conversion loss of an electrode structure similar to that of the fourth embodiment, but a directionality is corrected; and FIG. 16 is a graph denoting a theoretical insertion loss of the fourth embodiment.

DESCRIPTION OF THE PREFERRED EMBODIMENTS

Figure 1:
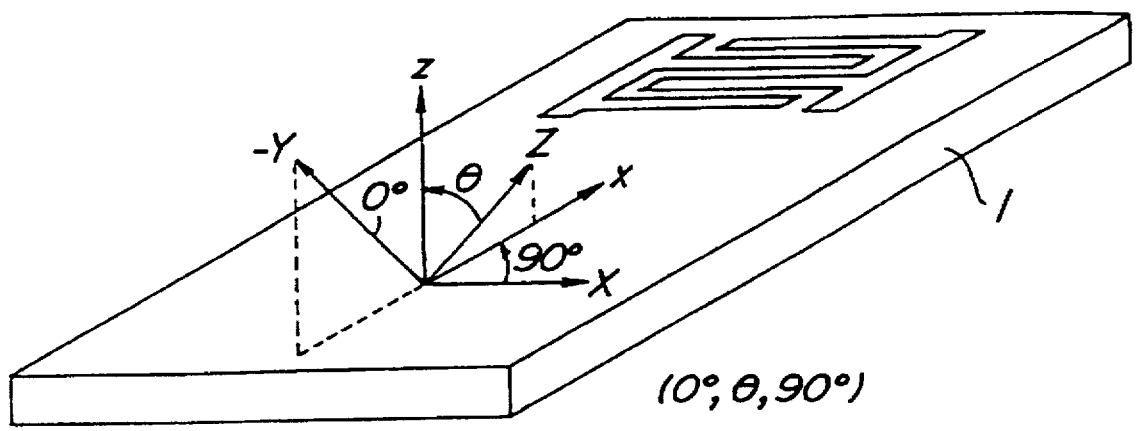
FIG. 1 is a schematic view for explaining the cut angles of the lithium tetraborate substrate used in the surface acoustic wave device according to the invention.

FIG. 1 is a schematic view showing a relationship between coordinates and crystal axes of a lithium tetraborate substrate of the surface acoustic wave device according to the invention. In the present specification, cut angles of the lithium tetraborate single crystal constituting a substrate 1 are represented by Euler angles (ψ, θ, φ). According to the invention, a cut angle ψ is set to a value within a range −5°~5° and a cut angle φ is set to a value within a range of 85°~95°. In FIG. 1, these cut angles ψ and φ are set to ideal values of 0° and 90°, respectively. A cut angle θ is most important for obtaining the NSPUDT behaviour and is represented by an angle between a crystal axis Z and a coordinate axis z. In the present invention, this cut angle θ is set to a value within ranges 9°~29° and 32°~86°.

In the lithium tetraborate substrate 1, the cut angles for realizing the desired NSPUDT property may be derived by an analysis combining two theories, i.e. the coupling-of-mode (COM) theory which reflects a perturbation effect of electrode upon an analysis for operation of a transducer as a primary effect, and a perturbation theory in which a particle velocity and a potential of a surface acoustic wave, material of electrodes and a dependency upon the electrode structure can be represented in a closed form. The coupling-of-modes (COM) theory is governed by four parameters, self-coupling coefficient $\kappa_{11}$, mutual coupling coefficient $\kappa_{12}$, transduction coefficient $\zeta$ and static capacitance C per unit length and per unit width. Among these parameters, the mutual coupling coefficient $\kappa_{12}$ is directly related to the electrode reflection so that it is essential for the NSPUDT behaviour. In transducers using usual bidirectional interdigital electrode structures, the mutual coupling coefficient $\kappa_{12}$ is a real number, but in the NSPUDT and unidirectional interdigital electrode structure, the mutual coupling coefficient $\kappa_{12}$ is represented by a complex number.

According to a first order perturbation theory, a mutual coupling coefficient $\kappa_{12}$ normalized by a wavelength λ of a surface acoustic wave may be expressed as follows:

$$\kappa_{12}\lambda = |\kappa_{12}|\lambda e^{2j\theta_0} = K_E + K_M \frac{h}{\lambda} e^{2j\theta_M} \quad (1)$$

wherein h is a thickness of an electrode film, a first term $K_E$ on the right side represents an electrical perturbation of electrode and a second term denotes an elastic perturbation. Between the mutual coupling coefficient $\kappa_{12}$ and the a reflection coefficient of electrode per one wavelength there is the following relationship:

$$r_+ = -j \kappa_{12}^* \lambda, \quad r_- = -j \kappa_{12} \lambda \quad (2)$$

wherein $r_+$ and $r_-$ represent reflection coefficients viewed in a +x direction and a −x direction, respectively. In NSPUDT, $r_+ \neq r_-$. $\kappa_{12}^*$ represents a complex conjugate.

An optimum phasing condition for attaining an optimum NSPUDT behaviour may be expressed as follows:

$$\arg(\kappa_{12}\lambda)=\pm 90°, \ (\phi_0=\pm 45°) \quad (3)$$

In this equation, a positive sign is applied when a forward direction is coincided with +x direction in FIG. 1 and a negative sign is applied when a forward direction is $-x$ direction. If a thickness of the electrode is sufficiently thick so that the electrical perturbation may be ignored, a phase angle $2\phi_0$ of the mutual coupling coefficient $\kappa_{12}$ is determined by a phase angle $2\phi_M$ of the elastic perturbation term. Then, an optimum NSPUDT behaviour can be attained when $\phi_M=\pm 45°$. A unidirectionality D(dB) of NSPUDT is proportional to a magnitude of reflection coefficient or mutual coupling coefficient $\kappa_{12}$, when the equation (3) is satisfied.

The inventors have conducted theoretical analyses for three lithium tetraborate substrates having the cut angles of (0°, 90°, φ), (0°, θ, 90°) and (ψ, 90°, 90°) and large reflection coefficients and satisfying the above mentioned condition, while the electrode structure is made of aluminum. The electrode width is set to $\lambda/4$. As a result of such analyses, it has been confirmed that the lithium tetraborate substrate 1 having the cut angles (0°, θ, 90°) as illustrated in FIG. 1 shows NSPUDT behaviour.

Figure 2:
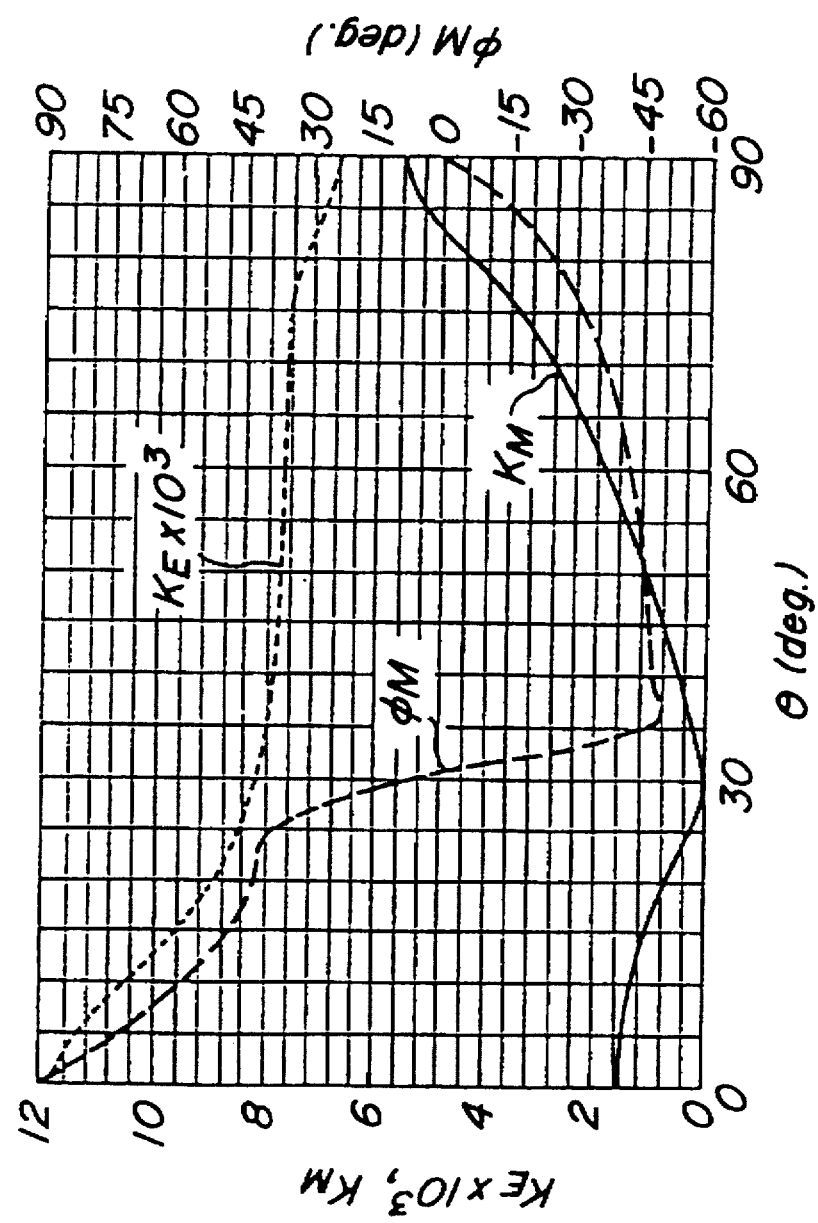
FIG. 2 is a graph representing a variation of several parameters representing a reflection of a surface acoustic wave by a normal type electrode of λ/4 with respect to the cut angle θ in the SAW device according to the invention.

FIG. 2 is a graph showing values of $K_E$, $K_M$ and $\phi_M$ at the above mentioned cut angles while θ is taken as a parameter. Among these values, $\phi_M$ contributes to the directivity most largely. According to the invention, θ is set to a value within such a range that $15° \leq |\phi_M| \leq 60°$ is satisfied, while a range near θ=30° is excluded, because in said range no reflection occurs.

FIG. 3 is a graph representing variations of the SAW velocity $V_R$, electromechanical coupling constant $K^2$ and temperature coefficient of delay TCD, while the angle θ is shown on the axis of absissa. From FIGS. 2 and 3, it is seen that at θ=18°, $\phi_M=+45°$; and θ=51°, $\phi_M=-45°$. There is not a large difference between values of $K^2$ at these cut angles of θ, but near θ=18°, $K_M$ is small, so that a thickness of the electrode structure has to be substantially large in order to increase the directivity. Within the range of θ=50°~86°, TCD is comparatively small, and thus it is expected to obtain good NSPUDT behavior.

A sign of $\phi_M$ within a range of θ=30° is opposite to that within a range of θ>30°, and therefore a forward direction of NSPUDT at θ=18° becomes also opposite to that at θ=51° although a same electrode structure is used.

Within the range of 51°<θ, $\phi_M$ deviates from −45° in accordance with an increase in θ so that NSPUDT deviates from an ideal one. However, this deviation can be corrected by changing the electrode structure. In this range of 51°<θ, $K_M$ is large so that a relatively large directivity can be attained by a thin electrode film. Moreover, this range of 51°<θ includes a zero TCD cut (θ=78°), and thus NSPUDT having good temperature characteristics can be realized. A power flow angle (PFA) of a substrate having cut angles (0°, θ, 90°) is zero, and therefore the above range of θ is practically useful.

Table 1 shows mode coupling parameters and SAW characteristics of lithium tetraborate substrates of (0°, 51°, 90°) cut satisfying the optimum phase condition and of (0°, 78°, 90°) cut attaining zero TCD, while the normal type electrode structure is used. In the Table 1, values of quartz substrate and LiTaO$_3$ substrate are also shown for comparison.

TABLE 1

Characteristics of NSPUDT Substrate (Al electrode, $\frac{a}{\lambda}=0.25$, $H=\frac{h}{\lambda}$, $C_s$: capacitance per electrode pair)

| substrate | | $V_R$ [m/s] | $C_s$ [pF/m] | $\kappa_{11}\lambda$ | $\kappa_{12}\lambda$ | $\frac{(\zeta\lambda)^2}{\omega C_s}$ | $K^2$(%) | TCD (ppm) | PFA(°) |
|---|---|---|---|---|---|---|---|---|---|
| Li$_2$B$_4$O$_7$ | (0°, 78°, 90°) | 3449 | 84 | 0.0238 −1.006H | 0.00748 +3.94e$^{-j57.7°}$H | 0.00374 | 1.04 | 0 | 0 |
| | (0°, 51°, 90°) | 3246 | 84 | 0.0247 +0.809H | 0.00774 +1.297e$^{-j90.4°}$H | 0.00387 | 1.08 | 38 | 0 |
| quartz | STX + 25° | 3249 | 49 | 0.0031 +0.801H | 0.00097 +0.475e$^{j91.5°}$H | 0.000486 | 0.13 | −16 | 5.02 |
| LiTaO$_3$ | YZ + 51.25° | 3213 | 447 | 0.0121 +0.517H | 0.0038 +0.785e$^{j91°}$H | 0.001899 | 0.52 | ≅50 | 0.54 |

FIGS. 4 and 5 represent the conversion loss of NSPUDTs with the normal type electrode structure of $\lambda=15$ μm, the number of electrode pairs of 50 and an aperture length of 200 $\lambda$, the conversion loss is calculated by using the parameter values shown in the Table 1. FIG. 4 shows the conversion loss of a lithium tetraborate substrate of (0°, 51°, 90°) cut and h/$\lambda$=0.025, and FIG. 5 represent the conversion loss of a lithium tetraborate substrate of (0°, 78°, 90°) cut and h/$\lambda$=0.01. A solid line represents the conversion loss in −x direction in FIG. 1 and a broken line denotes the conversion loss in +x direction. At a center frequency, a difference between the forward and backward conversion losses is large and the unidirectionality is clearly recognized. As can be understood by comparing the graphs illustrated in FIGS. 4 and 5, the substrate of FIG. 4 reveals the ideal unidirectionality and the substrate of FIG. 5 shows a slight deviation in the unidirectionality, but a still large unidirectionality can be obtained with a thin electrode structure.

As explained above, the lithium tetraborate substrate according to the invention shows good unidirectionality, but when such a substrate is used for a SAW filter, there occurs a problem. That is, when transmitter side and receiver side transducers having the same electrode structure are arranged on the lithium tetraborate substrate such that these transducers face each other, the forward directions of transducers orient in the same direction, so that the insertion loss becomes very large. In order to realize a practically usable SAW filter having a small insertion loss, the forward direction of the transmitter side transducer should be opposite to that of the receiver side transducer. In other words, in order to reduce the insertion loss, the directivity of one of the transducers has to be reversed or cancelled out. In the latter case, the reflection should be cancelled out with the aid of, for instance $\lambda/8$ double electrode structure. For instance, when the $\lambda/4$ normal type electrode structures are arranged on the lithium tetraborate substrate of (0°, 78°, 90°) cut as both the transmitter side and receiver side transducers, a frequency characteristic of a SAW filter, i.e. the insertion loss becomes as illustrated in FIG. 6. This frequency characteristic shows that the filter cannot be used as a transversal filter in which the transmitter side transducer and receiver side transducer are arranged to face each other.

When λ/8 double electrode structures are arranged on the lithium tetraborate substrate of (0°, 78°, 90°) cut as both the transmitter side and receiver side transducers, a frequency characteristic of a SAW filter becomes as illustrated in FIG. 7. It can be understood that the frequency characteristic can be substantially improved as compared with FIG. 6, but there are relatively large ripples near a desired frequency. Further, due to the bidirectionality of the electrode structure, a theoretical minimum insertion loss is 6 dB, so that it is rather difficult to realize a practically usable SAW filter having a small insertion loss. This tendency is also seen when the lithium tetraborate substrate having the ideal cut angles of (0°, 51°, 90°) is used.

Figure 8A:
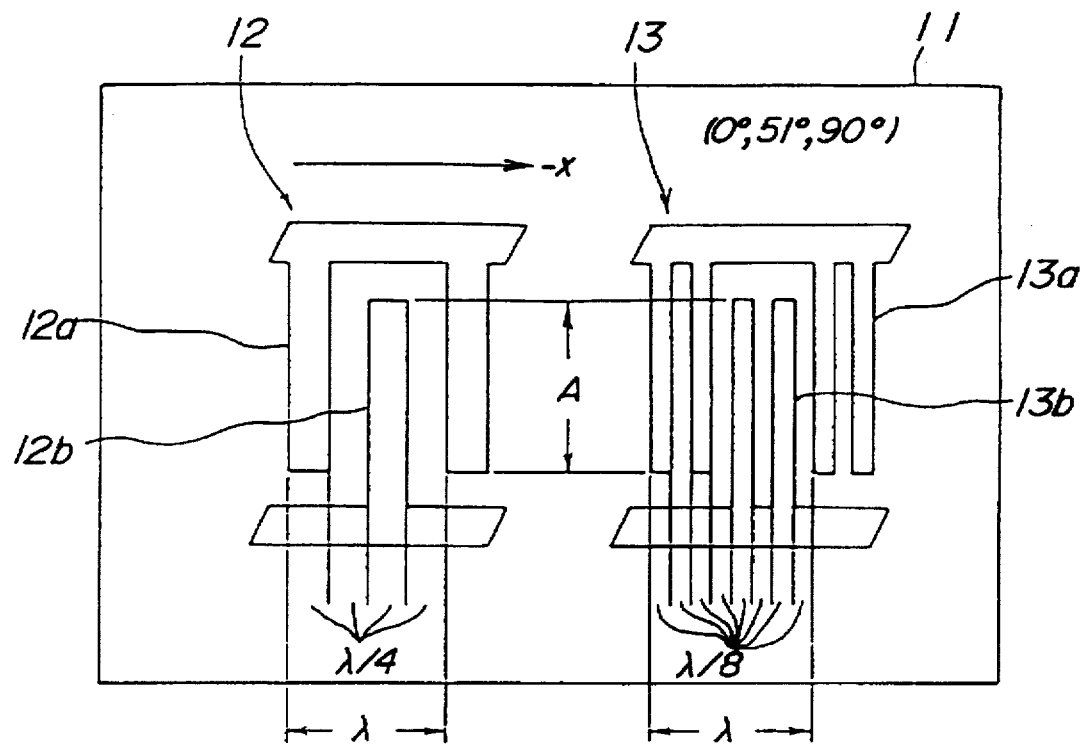
FIG. 8A is a plan view illustrating an electrode structure of a first embodiment of the SAW device according to the invention using a substrate having a cut angle θ=51°.

FIG. 8A is a plan view showing a first embodiment of the SAW filter according to the invention, in which on a lithium tetraborate substrate having the ideal cut angles of (0°, 51°, 90°) are arranged a λ/4 normal type electrode structure as the transmitter side transducer and ten pairs of double electrodes as the receiver side transducer. In order to confirm the unidirectionality of such a SAW filter, a structure illustrated in FIG. 8B was manufactured, in which a lithium tetraborate substrate 11 having the cut angles of (0°, 51°, 90°) is turned by 180° in a plane of the substrate and the transmitting direction (+x direction) of the λ/4 normal type electrode structure 12 is opposite to a λ/8 double electrode 13.

Figure 9:
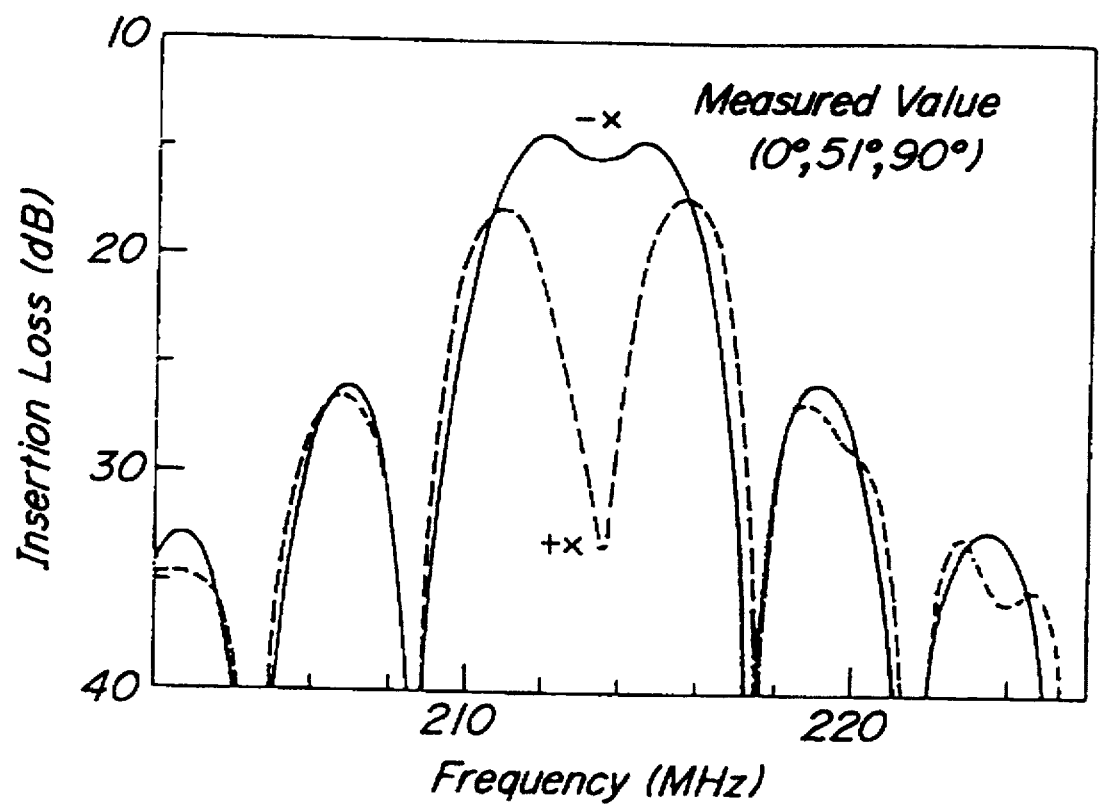
FIG. 9 is a graph representing an actually measured insertion loss of the SAW device shown in FIG.. 8A.

A solid line in FIG. 9 shows a measured insertion loss when the receiver side transducer electrode structure is arranged in the forward direction (−x direction) of the λ/4 normal type electrode structure, and a broken line denotes a measured insertion loss when the receiver side transducer electrode structure is arranged in the backward direction (+x direction) of the λ/4 normal type electrode structure. A net insertion loss of the SAW filter shown in FIG. 8A at a center frequency may be derived by subtracting a conversion loss (11.9 dB) of the double electrode structure from the insertion loss and becomes 3.7 dB and the directivity becomes 18 dB, this precisely correspond to the theoretical values (insertion loss is 3.03 dB and directionality is 14 dB) shown in FIG. 4.

Figure 8B:
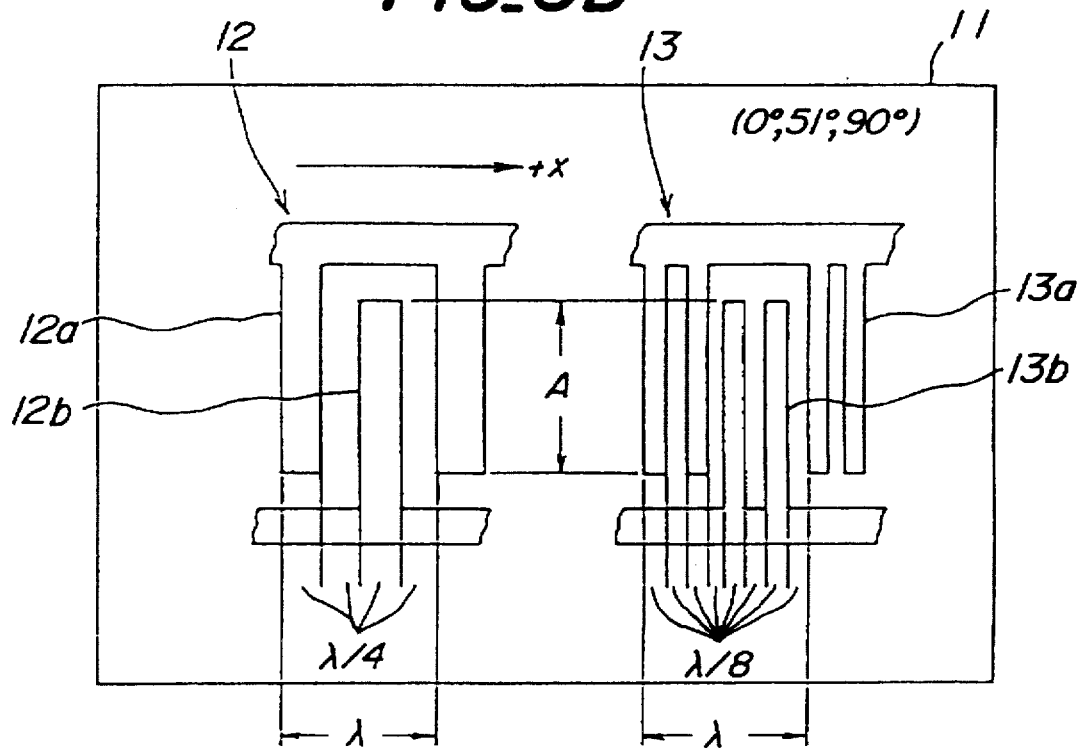
FIG. 8B is a plan view showing a SAW device in which the substrate is rotated in a plane of the drawing of FIG. 8A by 180°.

As illustrated in FIG. 8A, after depositing uniformly an aluminum film having a thickness of 0.37 μm on a surface of the (0°, 51°, 90°) cut lithium tetraborate substrate 11, the transmitter side transducer 12 and receiver side transducer 13 are formed on the surface of the lithium tetraborate substrate by using a well developed lithography technique. The transmitter side transducer 12 is constructed by the normal type electrode structure having interdigital electrodes, in which positive electrode fingers 12a and negative electrode fingers 12b each having a width of λ/4, i.e. 15/4 μm are opposed to each other alternately with an edge distance of substantially λ/4. The number of electrode pairs is 50. An aperture length A which is defined as a length of a part of the electrodes at which the positive and negative electrodes are overlapped with each other is about 200 μm. In the present embodiment, the receiver side electrode structure is formed by the double electrode structure, in which two positive electrode fingers 13a and two negative electrode fingers 13b are arranged alternately with an edge distance of λ/8, each electrode finger having a width of λ/8. The number of electrode pairs is ten and the aperture length A is 200 λ. In FIGS. 8A and 8B, substantially one period of each electrode structures is shown at an enlarged scale for the sake of clearness.

Figure 10:
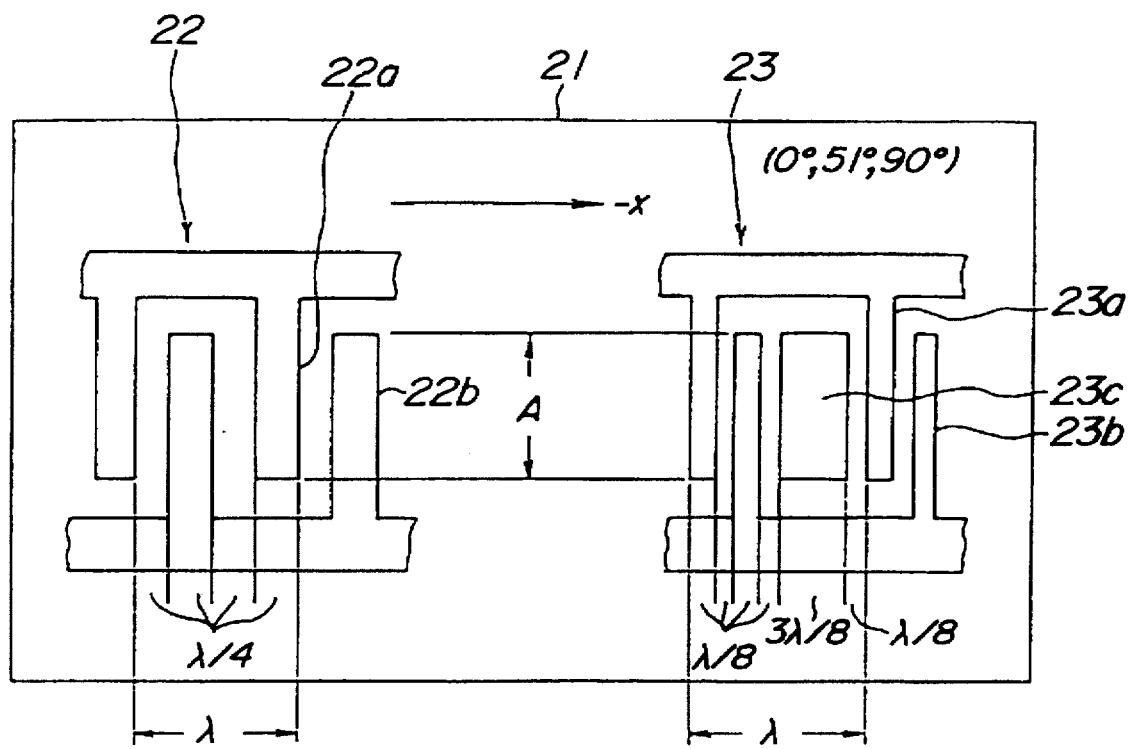
FIG. 10 is a plan view depicting en electrode structure of a second embodiment of the SAW device according to the invention using a substrate having a cut angle θ=51°.

FIG. 10 illustrates a second embodiment of the SAW filter according to the invention. Also in the present embodiment, use is made of a (0°, 51°, 90°) cut lithium tetraborate substrate 21, and a normal type electrode structure of λ/4 is arranged on the substrate as a transmitter side transducer 22. In the present embodiment, a receiver side transducer 23 is formed by a directionality reversed electrode structure. In this directionality reversed electrode structure, positive and negative electrode fingers 23a and 23b each having a width of λ/8 are arranged with an edge distance of λ/8 and a floating electrode 23c is inserted between a negative electrode finger 23b of an electrode pair and a positive electrode finger 23a of a next pair with an edge distance of λ/8. In FIG. 10, only one period of the electrode structures of the transmitter side transducer 22 and receiver side transducer 23 are shown for the sake of clearness.

Figure 11:
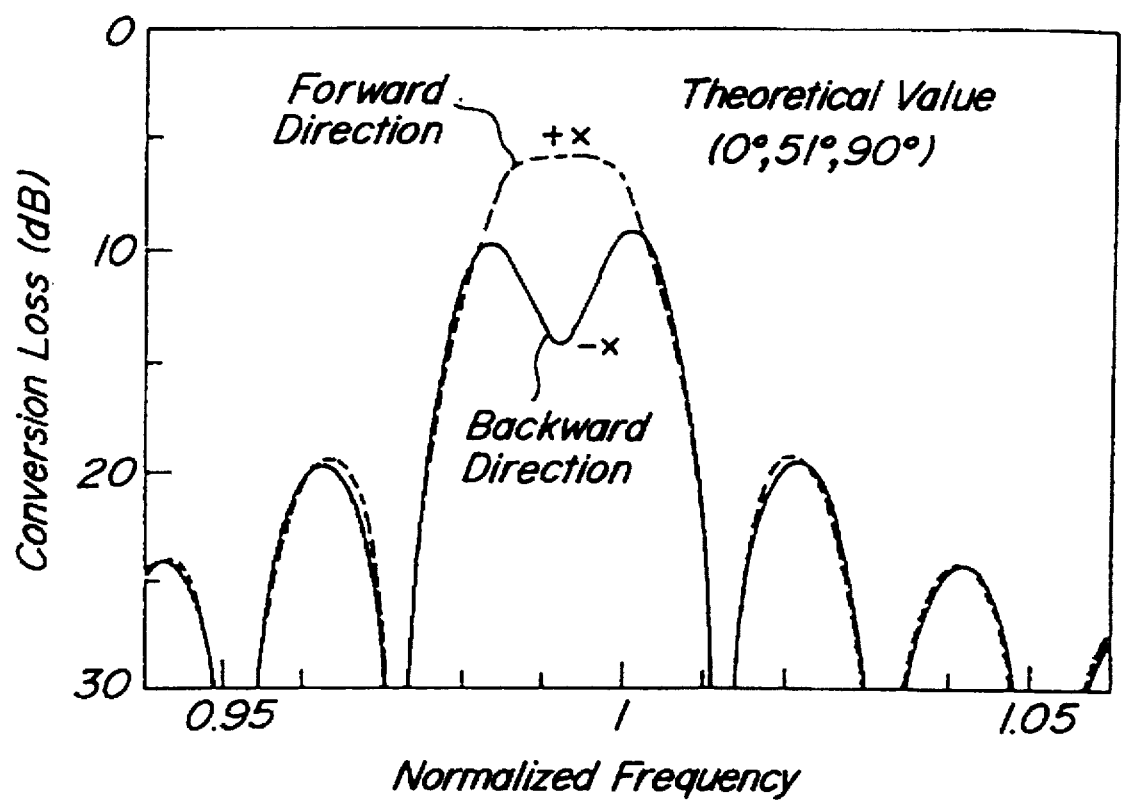
FIG. 11 is a graph showing a theoretical conversion loss of a directionality reversed electrode structure of the second embodiment shown in FIG. 10.

By using the above explained directionality reversed electrode structure 23, it is possible to receive efficiently a surface acoustic wave transmitted from the transmitter side transducer 22. FIG. 11 represents a conversion loss of the directionality reversed electrode structure in the present embodiment. In FIG. 11, a broken line shows a conversion loss in the +x direction which is opposite to the directionality of the transmitter side transducer 22 shown in FIG. 4, so that the SAW filter illustrated in FIG. 10 has an improved phase characteristic in which the insertion loss as well as the ripple are sufficiently small.

When the (0°, 78°, 90°) cut lithium tetraborate substrate shown in FIG. 5 is used, the directivity is somewhat deviated as compared with the (0°, 51°, 90°) cut lithium tetraborate substrate shown in FIG. 4. However, according to the invention, even if θ deviates largely from the ideal values of θ=18° and θ=51°, an undesired deviation of the directivity can be corrected by slightly changing the construction of the electrode structure. Now, an example of such a correction will be explained for θ=78°.

Figure 12:
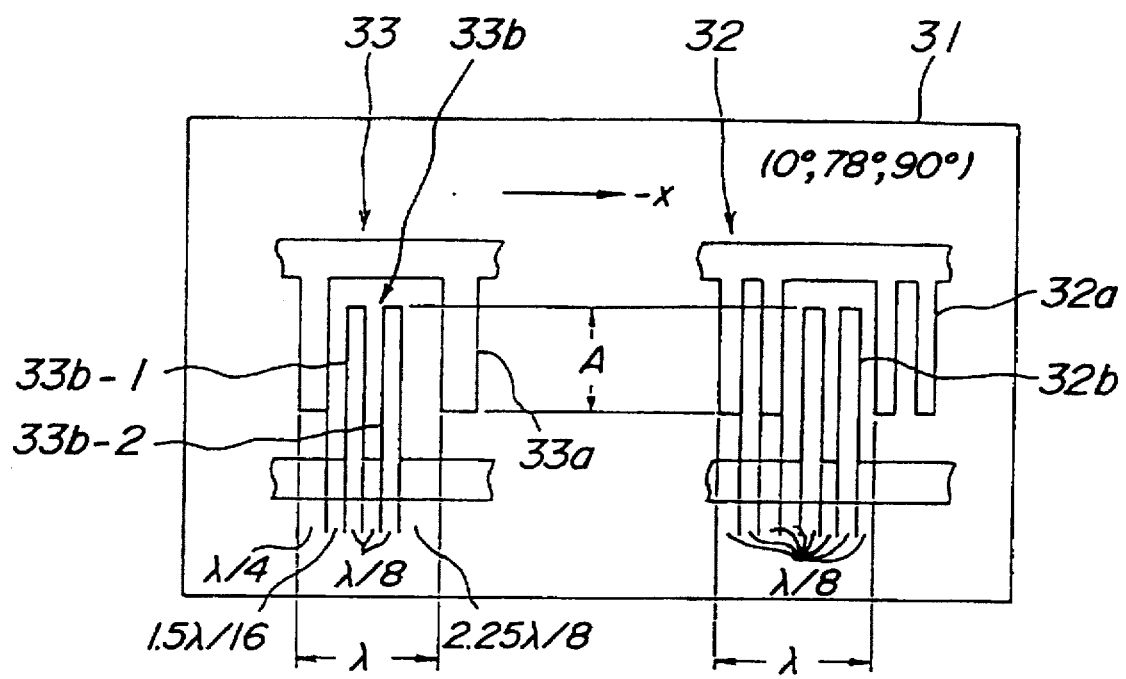
FIG. 12 is a plan view illustrating an electrode structure of a third embodiment of the SAW device according to the invention using a substrate having a cut angle θ=78°.

FIG. 12 is a plan view showing a third embodiment of the surface acoustic wave device according to the invention. In this embodiment, on a (0°, 78°, 90°) cut lithium tetraborate substrate there are formed a receiver side transducer of a λ/8 double electrode structure and a transmitter side transducer which is basically identical with the λ/4 normal type electrode structure but is slightly changed in order to correct the above mentioned deviation in the directionality shown in FIG. 5.

A receiver side transducer 32 formed on a (0°, 78°, 90°) cut lithium tetraborate substrate 31 is formed by a double electrode structure in which two positive electrode fingers 32a and two negative electrode fingers 32b each having a width of λ/8 are arranged alternatively with an edge distance of λ/8. The number of electrode pairs is ten and the aperture length A is 200 λ. The transmitter side transducer 33 comprises positive electrode fingers 33a arranged with a pitch of λ/4 and a negative electrode 33b arranged between successive positive electrode fingers 33a includes a first negative electrode finger 33b-1 separated from a positive electrode finger 33a of a relevant electrode pair by a distance of 1.5 λ/16 viewed in a propagating direction of the surface acoustic wave and a second negative electrode finger 33b-2 separated from the first negative electrode finger 33b-1 by a distance λ/8. Therefore, a distance between the second negative electrode finger 33b-2 and a positive electrode finger 33a of a next electrode pair is 2.25 λ/8.

Figure 13:
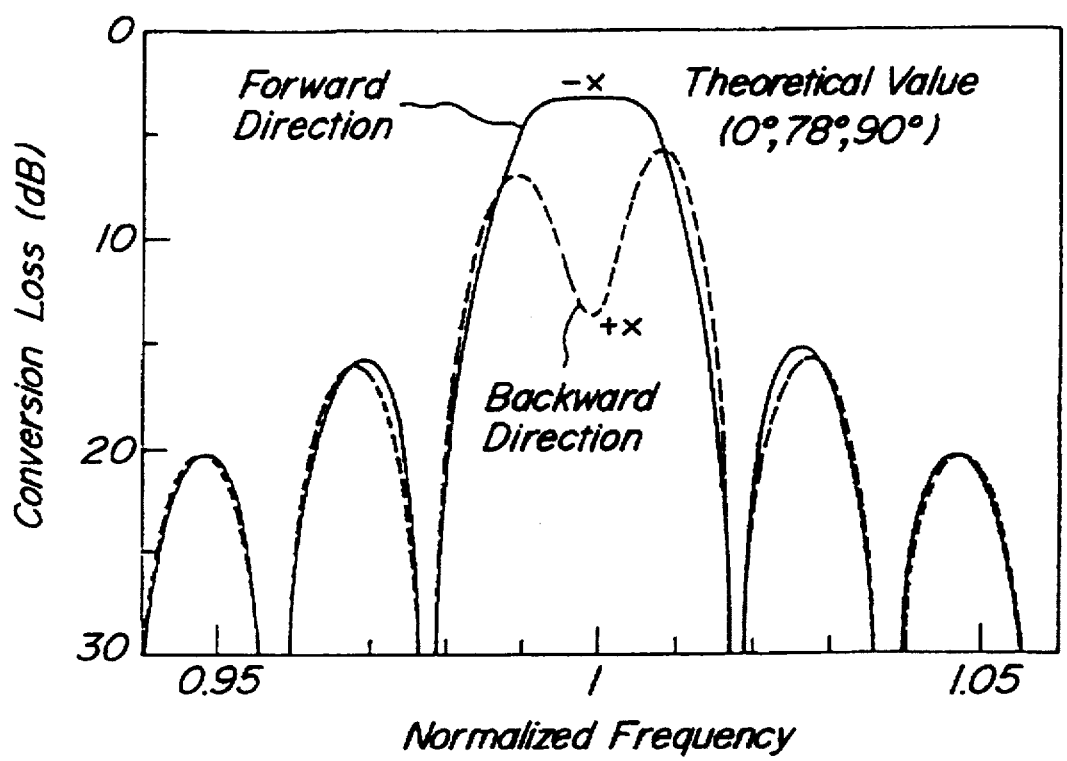
FIG. 13 is a graph representing a theoretical conversion loss of an electrode structure similar to that of the third embodiment, but a directionality is corrected.

FIG. 13 shows a frequency dependency of a conversion loss of the transmitter side transducer 33 of the present embodiment. It can be clearly understood that in the present embodiment, the deviation in the directionality is corrected as compared with the conversion loss shown in FIG. 5. In this manner, in the present embodiment, although the (0°, 78°, 90°) cut lithium tetraborate substrate 31 is used, good frequency characteristic can be obtained by slightly changing the construction of the electrode structure.

FIG. 14 illustrates a fourth embodiment of the surface acoustic wave device according to the invention. In the present embodiment, on a (0°, 78°, 90°) cut lithium tetraborate substrate there are arranged a transmitter side transducer formed by a directionality corrected electrode structure and a receiver side transducer is formed by a directionality reversed electrode structure having a corrected directionality. On a (0°, 78°, 90°) cut lithium tetraborate substrate 41 is provided a directionality corrected electrode structure 42 as the transmitter side transducer, said electrode structure being identical with the electrode structure 33 shown in FIG. 12. That is, the transmitter side transducer 42 comprises positive electrode fingers 42a arranged with a pitch of λ/4 and a negative electrode 42b arranged between successive positive electrode fingers 42a includes a first negative electrode finger 42b-1 separated from a positive electrode finger 42a of a relevant electrode pair by a distance of 1.5 λ/16 and a second negative electrode finger 42b-2 separated from the first negative electrode finger 42b-1 by a distance λ/8. The receiver side transducer 43 comprises positive electrode finger 43a, negative electrode finger 43b and floating electrode 43c like the directionality reversed electrode structure shown in FIG. 10, but in the present embodiment the floating electrode 43c is shifted toward negative electrode finger 43b, i.e. toward the transmitter side transducer 42 by a distance of 2 λ/56. Therefore, an edge distance between the negative electrode finger 43c and the floating electrode 43c becomes λ(1/8−2/56) and an edge distance between the floating electrode 43c and the positive electrode finger 43a becomes λ(1/8+2/56).

FIG. 15 is a graph showing a conversion loss of the receiver side transducer 43 formed by the directionality reversed electrode structure having corrected directionality. In the present embodiment, not only is the directionality reversed, but the deviation in the directionality seen in the conversion loss shown in FIG. 5 can also be corrected sufficiently.

FIG. 16 denotes a frequency dependency of the insertion loss of the SAW filter according to the invention. As can be seem from a comparison with FIG. 7, in the present embodiment, a ripple as well as an insertion loss are reduced.

In the lithium tetraborate substrate used in the present invention, within the ranges of θ of 9°−29° and 32°−86°, a variation of the value of $\phi_M$ contributing to NSPUDT largely is relatively slow, and further a deviation of the directivity can be corrected by slightly altering the electrode structure. Therefore, in the present invention it is possible to realize a practically usable surface acoustic wave device having a good property by setting the cut angle θ to said ranges.

The present invention is not limited to the embodiments explained above, but many alternations and modifications can be conceived by those skilled in the art within the scope of the invention. In the above embodiments, the lithium tetraborate substrates of the (0°, 51°, 90°) cut angles realizing the ideal NSPUDT behaviour and of the (0°, 78°, 90°) cut angles obtaining the zero TCD, but it is apparent that lithium tetraborate substrates having any cut angles within the ranges defined in claims may be equally used. In this case, a deviation of the directionality can be corrected by changing the electrode structure in a similar manner to that of the above mentioned embodiments or changing positions of electrodes.

Moreover, in the above embodiments, the surface acoustic wave device according to the invention is constructed as a SAW filter, but in the present invention, the surface acoustic wave device may be constructed as a surface acoustic wave resonator. In this case, grating reflectors may be arranged on both sides of a λ/4 normal type electrode structure or directionality corrected electrode structure.

Furthermore, in the above embodiments, while all the electrodes are made of aluminum, they may be made of other electrode material. However, in this case, all the electrodes are made of a same material.

Since the operation of both transmitter and receiver side transducers is reciprocal, in the above embodiments the transmitter side transducer and receiver side transducer may be reversed. For instance, in the first and second embodiments, the transmitter side transducer may be formed by the double electrode structure or directionality reversed electrode structures and the receiver side transducer may be formed by the normal type electrode structure.

It should be further noted that the desired object of the present invention can be attained although the electrode width and electrode edge distance deviate from desired values by about ±10% errors due to precise working.

As explained above, in the surface acoustic wave device according to the invention, the natural single-phase unidirectional transducer behaviour can be obtained by a combination of the anisotropy of the lithium tetraborate substrate having given cut angles and the electrode structure, and it is possible to realize the surface acoustic wave device having a small insertion loss and an improved phase characteristic. The electrode structure to be used in combination with such a substrate having an anisotropy may be of the λ/4 base normal-type electrode structure or λ/8 double electrode structure or directionality reversed electrode structure. These electrode structures can be manufactured precisely and easily, so that a yield is improved. Moreover, it is possible to reverse a directionality of NSPUDT without making the transmitter side electrode structure and the receiver side electrode structure of different materials, so that a SAW filter can be designed and manufactured very easily.

What is claimed is:

1. A surface acoustic wave device comprising:

a substrate made of a single crystal of lithium tetraborate ($Li_2B_4O_7$) whose cut and propagating direction are determined such that cut angles represented by Euler angles ($\psi$, θ, $\phi$) are $\psi=+5°\sim-5°$, $\theta=9°\sim29°$ and $32°\sim86°$ and $_\phi=85°\sim95°$; and at least one electrode structure formed on a surface of said substrate to realize a natural single-phase unidirectional transducer property together with an anisotropy of said substrate.

2. A surface acoustic wave device according to claim 1, wherein said electrode structure for realizing a natural single-phase unidirectional transducer property together with an anisotropy of the substrate is formed by a normal type electrode structure including positive electrode fingers and negative electrode fingers which are to be connected to two terminals of a single-phase signal source or a load having a phase difference of 180° and have a width of about λ/4, said positive and negative electrode fingers being arranged alternately with an edge distance of about λ/4, wherein λ is a wavelength of a surface acoustic wave.

3. A surface acoustic wave device according to claim 2, wherein said normal type electrode structure is arranged as a transmitter side transducer or a receiver side transducer and a double electrode structure is provided as a receiver side transducer or a transmitter side transducer, and in said double electrode structure two positive electrode fingers and two negative electrode fingers each having a width of about $\lambda/8$ are alternately arranged with an edge distance of about $\lambda/8$.

4. A surface acoustic wave device according to claim 2, wherein said normal type electrode structure is arranged as a transmitter side transducer or a receiver side transducer and a directionality reversed electrode structure is provided as a receiver side transducer or a transmitter side transducer, and in said directionality reversed electrode structure, positive electrode finger and negative electrode finger each having a width of about $\lambda/8$ are alternately arranged with an edge distance of about $\lambda/8$ at a pitch of about $\lambda$ and a floating electrode having a width of about 3 $\lambda/8$ is arranged between a negative electrode finger of an electrode pair and a positive electrode finger of a next electrode pair with an edge distance of about $\lambda/8$.

5. A surface acoustic wave device according to claim 1, wherein said electrode structure for realizing a natural single-phase unidirectional transducer property together with an anisotropy of the substrate is formed by a directionality corrected electrode structure including a positive electrode and a negative electrode which are to be connected to two terminals of a single-phase signal source or a load having a phase difference of 180°, said positive electrode includes positive electrode fingers having a width of about $\lambda/4$, wherein $\lambda$ is a wavelength of a surface acoustic wave and being arranged with a pitch of $\lambda$, and said negative electrode includes first electrode fingers each having a width of about $\lambda/8$ and separated from respective positive electrode fingers by an edge distance of about 1.5 $\lambda/16$ and second negative electrode fingers each having a width of about $\lambda/8$ and separated from respective first negative electrode fingers by an edge distance of about $\lambda/8$.

6. A surface acoustic wave device according to claim 5, wherein said directionality corrected electrode structure is provided as a transmitter side transducer or a receiver side transducer and a double electrode structure is provided as a receiver side transducer or a transmitter side transducer, and in said double electrode structure, two positive electrode fingers and two negative electrode fingers each having a width of about $\lambda/8$ are alternately arranged with an edge distance of about $\lambda/8$.

7. A surface acoustic wave device according to claim 5, wherein said directionality corrected electrode structure is provided as a transmitter side transducer or a receiver side transducer and a directionality reversed electrode structure is arranged as a receiver side transducer or a transmitter side transducer, and in said directionality reversed electrode structure, positive electrode finger and negative electrode finger each having a width of about $\lambda/8$ are alternately arranged with an edge distance of about $\lambda/8$ at a pitch of about $\lambda$ and a floating electrode having a width of about 3 $\lambda/8$ is arranged between a negative electrode finger of an electrode pair and a positive electrode finger of a next electrode pair with an edge distance of about $\lambda/8$.

8. A surface acoustic wave device according to claim 5, wherein said directionality corrected electrode structure is provided as a transmitter side transducer or a receiver side transducer and a directionality reversed electrode structure having a corrected directionality is provided as a receiver side transducer or a transmitter side transducer, and in said directionality reversed electrode structure, positive electrode fingers each having a width of about $\lambda/8$ are arranged at a pitch of about $\lambda$, negative electrode fingers each having a width of about $\lambda/8$ are arranged with an edge distance from positive electrode fingers of about $\lambda/8$ and floating electrodes each having a width of about 3 $\lambda/8$ are arranged with an edge distance from respective negative electrode fingers of about $(1/8-2/56)$ $\lambda$.

9. A surface acoustic wave device according to claim 2, wherein all electrodes of the transmitter side transducer and receiver side transducer are made of a same electrode material.

10. A surface acoustic wave device according to claim 1, wherein said substrate is made of a lithium tetraborate single crystal having the Euler cut angles of about (0°, 51°, 90°).

11. A surface acoustic wave device according to claim 1, wherein said substrate is made of a lithium tetraborate single crystal having the Euler cut angles of about (0°, 78°, 90°).

12. A surface acoustic wave device according to claim 9, wherein said substrate is made of a lithium tetraborate single crystal having the Euler cut angles of about (0°, 51°, 90°).

13. A surface acoustic wave device according to claim 9, wherein said substrate is made of a lithium tetraborate single crystal having the Euler cut angles of about (0°, 78°, 90°).

* * * * *